(12) United States Patent
Petrucci et al.

(10) Patent No.: US 9,329,218 B2
(45) Date of Patent: May 3, 2016

(54) ANTENNA MAST DETECTION METHODS AND SYSTEMS

(71) Applicant: GM GLOBAL TECHNOLOGY OPERATIONS LLC, Detroit, MI (US)

(72) Inventors: David R. Petrucci, Warren, MI (US); Gregg R. Kittinger, Pontiac, MI (US); Duane S. Carper, Davison, MI (US); Douglas C. Martin, Oxford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 557 days.

(21) Appl. No.: 13/868,810

(22) Filed: Apr. 23, 2013

(65) Prior Publication Data
US 2014/0055306 A1 Feb. 27, 2014

Related U.S. Application Data

(60) Provisional application No. 61/693,094, filed on Aug. 24, 2012.

(51) Int. Cl.
*H01Q 1/32* (2006.01)
*G01R 31/00* (2006.01)
*H01Q 1/12* (2006.01)

(52) U.S. Cl.
CPC ............. *G01R 31/006* (2013.01); *H01Q 1/12* (2013.01); *H01Q 1/1214* (2013.01); *H01Q 1/3275* (2013.01)

(58) Field of Classification Search
CPC ...... H01Q 1/12; H01Q 1/3275; H01Q 1/1214
USPC .................................................. 343/715, 703
See application file for complete search history.

(56) References Cited

U.S. PATENT DOCUMENTS

| | | | |
|---|---|---|---|
| 4,137,521 A | 1/1979 | Martinez |
| 4,293,860 A | 10/1981 | Iwata |
| 5,943,609 A | 8/1999 | Ericson et al. |
| 6,275,194 B1 | 8/2001 | Ansorge |
| 6,509,878 B1 | 1/2003 | Tornatta, Jr. et al. |
| 2004/0257284 A1 | 12/2004 | Rada et al. |

(Continued)

FOREIGN PATENT DOCUMENTS

| | | |
|---|---|---|
| CN | 1837839 A | 9/2006 |
| CN | 1873436 A | 12/2006 |

(Continued)

OTHER PUBLICATIONS

USPTO, Notice of Allowance and Fee(s) due in U.S. Appl. No. 13/868,832 mailed Nov. 20, 2015.

(Continued)

*Primary Examiner* — Dieu H Duong
(74) *Attorney, Agent, or Firm* — Ingrassia Fisher & Lorenz, P.C.

(57) ABSTRACT

Methods and systems are provided for detecting whether an antenna mast is coupled to an antenna. In one embodiment, a method of monitoring an antenna having a removable detection mechanism is provided. The method includes: monitoring voltage standing wave radio (VSWR) measurement data of the antenna; and selectively determining whether at least one of the detection mechanism and an antenna mast is installed based on the VSWR measurement data.

20 Claims, 4 Drawing Sheets

(56) References Cited

U.S. PATENT DOCUMENTS

| | | | |
|---|---|---|---|
| 2005/0085951 A1* | 4/2005 | Walker | B60R 25/04 701/1 |
| 2006/0094368 A1 | 5/2006 | Lee et al. | |
| 2008/0198077 A1* | 8/2008 | Duzdar | H01Q 21/30 343/715 |
| 2011/0287820 A1 | 11/2011 | Harrison et al. | |
| 2014/0055320 A1 | 2/2014 | Petrucci et al. | |

FOREIGN PATENT DOCUMENTS

| | | |
|---|---|---|
| CN | 101741482 A | 6/2010 |
| CN | 202134651 U | 2/2012 |
| WO | 9524059 A2 | 9/1995 |

OTHER PUBLICATIONS

USPTO, Response to Office Action in U.S. Appl. No. 13/868,832 mailed Aug. 10, 2015.

USPTO, Office Action for U.S. Appl. No. 13/868,783 mailed Apr. 10, 2015.

USPTO, Office Action for U.S. Appl. No. 13/868,832 mailed Apr. 10, 2015.

State Intellectual Property Office of the People'S Republic of China, Office Action for Chinese Patent Application No. 201310372784.6 mailed May 5, 2015.

State Intellectual Property Office of the People'S Republic of China, Office Action for Chinese Patent Application No. 201310372676.9 mailed Sep. 25, 2015.

Notice of Allowance and Fee(s) Due in U.S. Appl. No. 13/868,783 mailed Oct. 22, 2015.

Response to Office Action in U.S. Appl. No. 13/868,783 mailed Jul. 14, 2015.

Petrucci, David R., US Patent Application, P0022364, entitled "Antenna Mast Detection Methods and Systems," filed on Apr. 22, 2013.

Petrucci, David R., US Patent Application, P022363, entitled "Antenna Mast Detection Methods and Systems," filed on Apr. 23, 2013.

State Intellectual Property Office of The People's Republic of China, Office Action in Chinese Patent Application No. 201310372784.6 mailed Dec. 28, 2015.

State Intellectual Property Office of The People's Republic of China, Office Action in Chinese Patent Application No. 201310372769.1 mailed Jan. 5, 2016.

\* cited by examiner

ANTENNA MAST DETECTION METHODS AND SYSTEMS

CROSS-REFERENCE TO RELATED APPLICATION

This application claims the benefit of U.S. provisional patent application Ser. No. 61/693,094, filed Aug. 24, 2012, which is hereby incorporated by reference in its entirety.

TECHNICAL FIELD

The technical field generally relates to vehicle antennas, and more particularly relates to methods and systems for detecting the installation of an antenna mast on the vehicle.

BACKGROUND

Some vehicle antennas are installed by a dealer after production and prior to delivering the vehicle to a customer. These antennas include antenna masts that couple to an antenna receiver of the vehicle. The antenna mast is typically loose shipped with the vehicle. A removable shipping cap is placed on the loose shipped antenna mast to protect antenna threads that couple to the receiver.

In some cases, the dealer can forget to install the antenna mast before delivering the vehicle to the customer. In other cases, the assembly plant does not include the antenna mast with the vehicle as received at the dealership, therefore the dealer does not install the antenna mast.

Accordingly, it is desirable to provide methods and systems for detecting the installation of the antenna mast. In addition, it is desirable to provide methods and systems for detecting whether the installation of the antenna mast was correct. Furthermore, other desirable features and characteristics of the present invention will become apparent from the subsequent detailed description and the appended claims, taken in conjunction with the accompanying drawings and the foregoing technical field and background.

SUMMARY

Accordingly, methods and systems are provided for monitoring an antenna having a removable detection mechanism. In one embodiment, a method includes: monitoring voltage standing wave radio (VSWR) measurement data of the antenna; and selectively determining whether at least one of the detection mechanism and an antenna mast is installed based on the VSWR measurement data.

In another embodiment, a system includes a first module and a second module. The first module monitors voltage standing wave radio (VSWR) measurement data of the antenna. The second module selectively determines whether at least one of the detection mechanism and an antenna mast is installed based on the VSWR measurement data.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
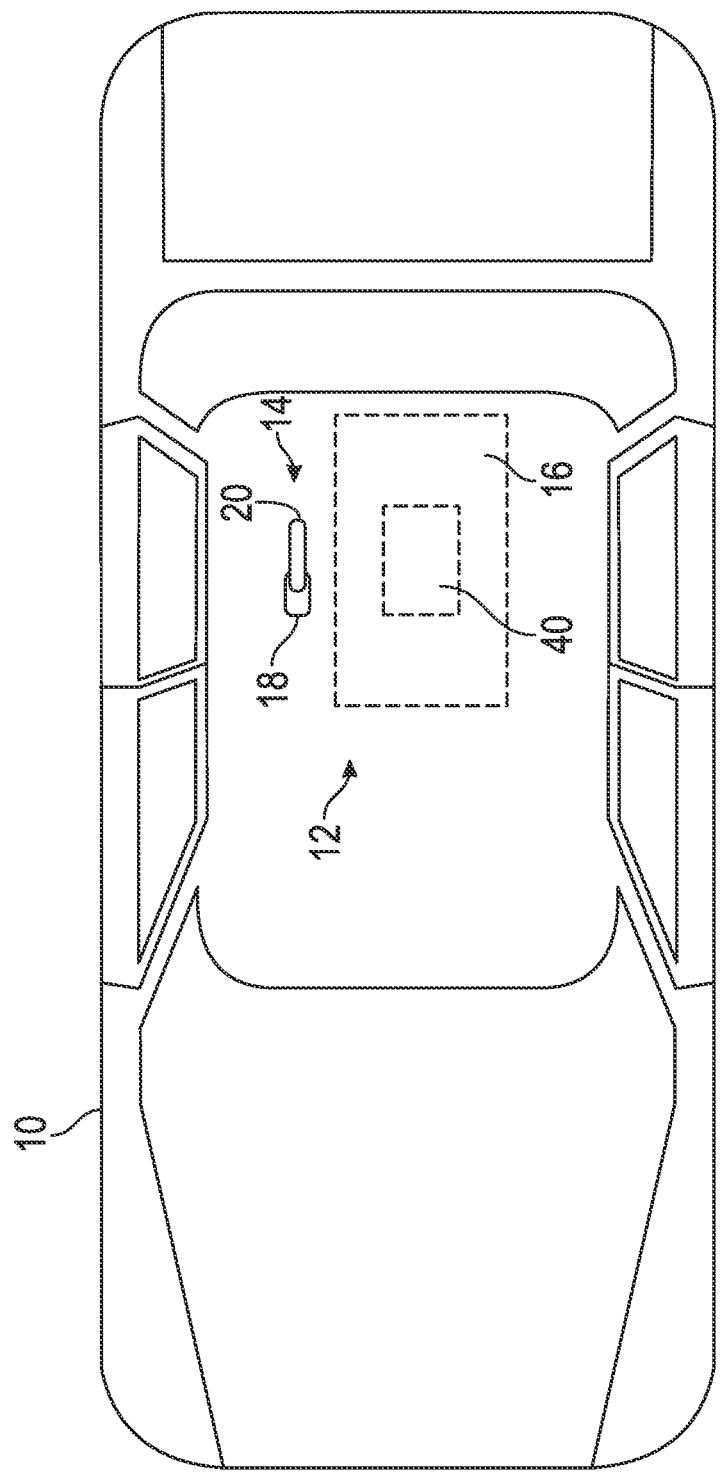
FIG. 1 is a diagram of a vehicle including an antenna monitoring system in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description, it should be understood that throughout the drawings, corresponding reference numerals indicate like or corresponding parts and features. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Referring now to FIG. 1, a vehicle 10 is shown having an antenna monitoring system shown generally at 12 in accordance with various embodiments. Although the figures shown herein depict an example with certain arrangements of elements, additional intervening elements, devices, features, or components may be present in an actual embodiments. It should also be understood that FIG. 1 is merely illustrative and may not be drawn to scale.

In FIG. 1, the vehicle monitoring system 10 is shown to include an antenna. shown generally at 14 communicatively coupled to an infotainment system 16. The antenna 14, when completely installed to the vehicle 10, includes an antenna base 18 and an antenna mast 20. As can be appreciated, the antenna 14 can be any antenna type including, but not limited to, cellphone antennas, and AM FM antennas, or multiband antennas. For exemplary purposes, the disclosure will be discussed in the context of a hexband antenna 14.

Figure 2:
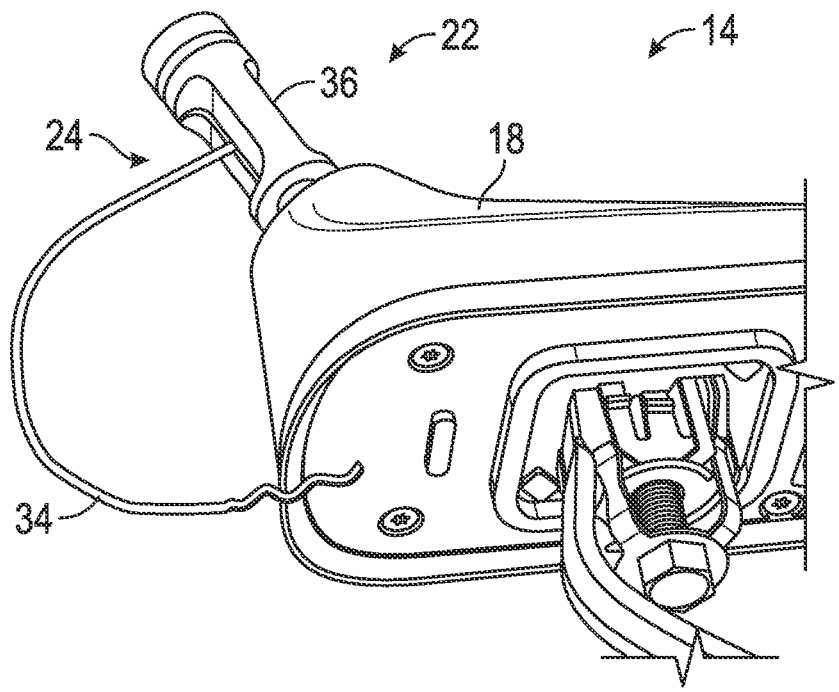
FIG. 2 is a perspective view of an antenna of the antenna system having a removable detection mechanism in accordance with various embodiments.

As shown in FIG. 2, prior to complete installation into the vehicle 10, a shipping cap 22 is removably coupled to the antenna base 18. When completing the installation of the antenna 14 to the vehicle 10, the shipping cap 22 is removed from the antenna base 18, and is replaced with the antenna mast 20 as shown in FIG. 3.

Figure 3:
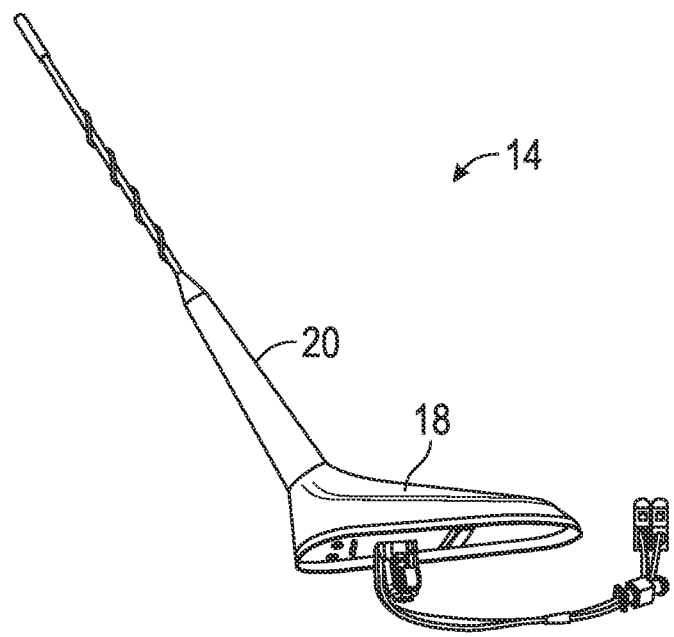
FIG. 3 is a perspective view of an antenna of the antenna system having an antenna mast installed in place of the removable detection mechanism in accordance with various embodiments.

As further shown in FIG. 2, the antenna 14 includes a detection mechanism shown generally at 24 for assisting in the detection of the installation of the antenna mast 20 (FIG. 3). The detection mechanism 24 is shown to be integrated with the shipping cap 22. As can be appreciated, in various other embodiments (not shown), the detection mechanism is implemented separate from the shipping cap 22 and/or installed in place of the shipping cap 22.

In various embodiments, the detection mechanism 24 can further include a shunt element 34 that movably couples to and extends from a body 28 of the shipping cap 22. When the shipping cap is installed to the antenna base 18, the shunt element 34 couples to a ground element (e.g., of the vehicle chassis) through the antenna base 18 (as shown in FIG. 2). When a contact is made between the shunt element 34 and the ground element, a no signal condition is created. In contrast, when no contact is made between the shunt element 34 and the ground element, a signal enable condition is created.

With reference back to FIG. 1, the infotainment system 16 includes an antenna monitoring module 40, In various other embodiments (not shown), the antenna monitoring module 40 communicates with (e.g., through a vehicle communication bus (not shown)) but is not part of the infotainment system 16. The antenna. monitoring module 40 communicates with the antenna 14 to determine if the antenna mast 20 has been installed and/or whether the antenna mast 20 has been damaged.

Figure 4:
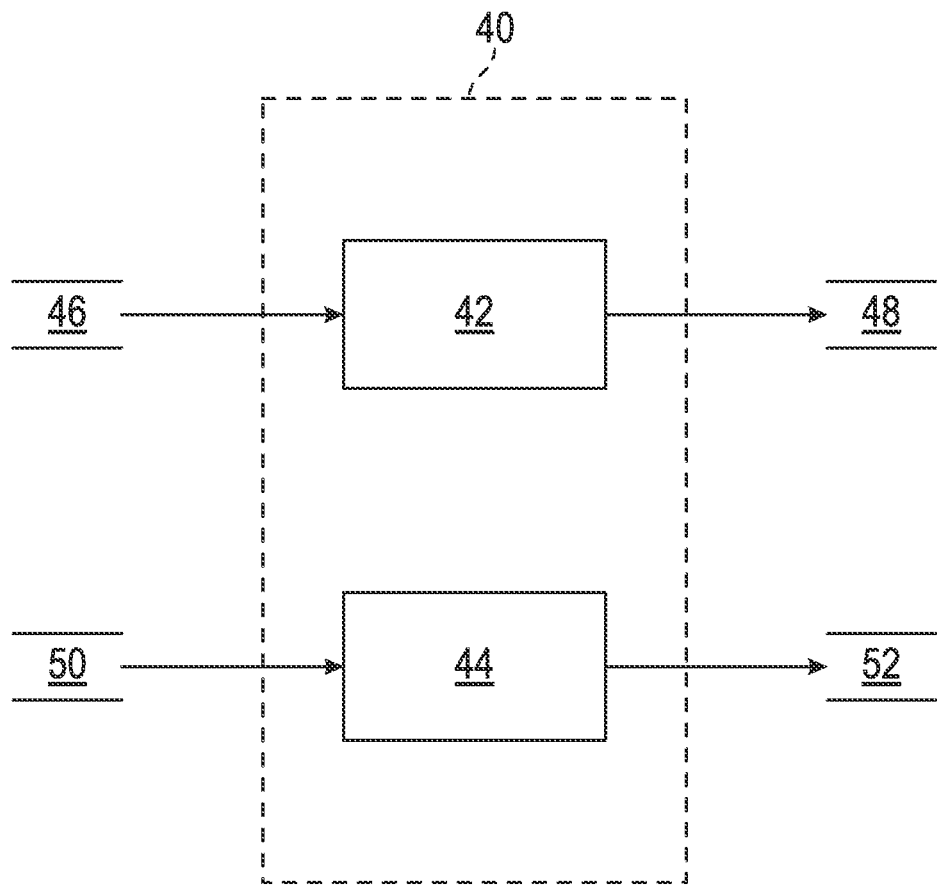
FIG. 4 is a dataflow diagram illustrating an antenna mast monitoring module in accordance with various embodiments.

Referring now to FIG. 4 and with continued reference to FIGS. 1-3, a dataflow diagram illustrates various embodiments of the antenna monitoring module 40 of the antenna monitoring system 12. Various embodiments of antenna monitoring modules 40 according to the present disclosure may include any number of sub-modules. As can be appreciated, the sub-modules shown in FIG. 4 may be combined and/or further partitioned to similarly monitor the antenna 14. Inputs to the antenna monitoring module 40 may be received from sensors, may be received from other modules that process sensed data, and or may be received from other control modules within the vehicle 10. In various embodiments, the antenna monitoring module 40 includes a mast detection module 42, and a mast health monitoring module 44.

The mast detection module 42 monitors various antenna data 46 to detect whether the antenna mast 20 has been installed. The mast detection module 42 generates warning signals 48 based on the monitoring, The warning signals 48 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast detection module 42 may be performed as a scheduled test prior to delivery of the vehicle 10.

The mast health monitoring module 44 monitors various antenna data 50 to detect the health of the antenna including the antenna mast 20, cable, and cable connections. The mast health monitoring module 44 generates warning signals 52 based on the monitoring. The warning signals 52 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast health monitoring module 44 may be performed as a scheduled test prior to delivery of the vehicle 10 and/or as a periodic test during operation of the vehicle 10 to detect a damaged antenna mast, or to detect whether the mast has been removed.

In various embodiments, the antenna data 50 includes voltage standing wave ratio (VSWR) measurement data and the mast health monitoring module 44 monitors the VSWR measurement data to determine a missing or damaged antenna mast 20. The VSWR data can be measured form a forward direction and/or a reverse direction (reflected) based on a test signal generated either by a transmitter of the antenna (e.g., in the case of a cellphone/radio antenna system), or a signal source other than the antenna (e.g., when the antenna is not equipped with a transmitter) such as a radio module or other vehicle module. The mast health monitoring module 44 monitors the VSWR measurement data based on a monitoring method as shown in FIG. 5 (as will be discussed in more detail below).

Figure 5:
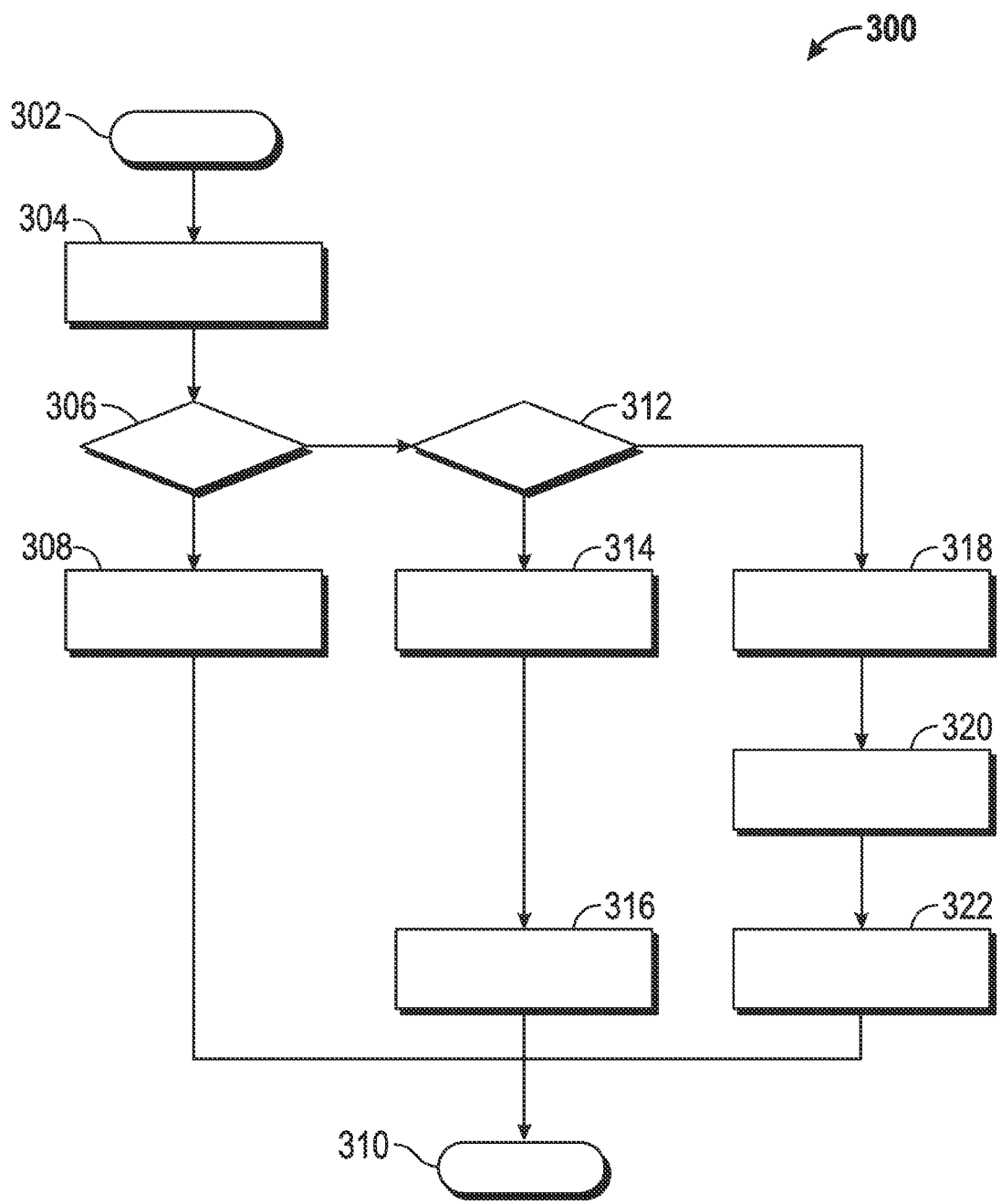
FIG. 5 is a flowchart illustrating an antenna mast monitoring method in accordance with various embodiments.

Referring now to FIG. 5, and with continued reference to FIGS. 1-4, a flowchart illustrates a monitoring method 300 that can be performed by the mast health monitoring module 44 in accordance with various embodiments. As can be appreciated in light of the disclosure, the order of operation within the method is not limited to the sequential execution as illustrated in FIG. 3, but may be performed in one or more varying orders as applicable and in accordance with the present disclosure. As can further be appreciated, one or more steps of the method may be added or deleted without altering the spirit of the method.

The monitoring method 300 of FIG. 3 monitors the VSWR measurement data to determine whether the detection mechanism 24 has been removed and the antenna mast 20 has been installed.

In one example, the method begins at 302. The VSWR data is monitored at 304 and evaluated at 306 and 312. If the VSWR data indicates that the power is within a range at 306, the antenna mast 20 is determined to be installed at 308. Thereafter, the method may end at 310.

If, however, the VSWR data indicates that the power is outside of the range at 306 and the power is greater than a top threshold of the range at 312, the detection mechanism 24 is determined to be installed at 314 and the warning signal 52 is generated indicating such at 316. Thereafter, the method may end at 310.

If, however, the VSWR data indicates that the power is outside of the range at 306 and the power is not greater than a top threshold of the range at 312 (i.e., it is less than a bottom threshold of the range), the detection mechanism 24 is determined to not be installed at 318 and the antenna mast 20 is determined to be damaged or not installed at 320. The warning signal 52 is generated indicating such at 322. Thereafter, the method may end at 310.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method of monitoring an antenna having a removable detection mechanism, comprising:
   monitoring voltage standing wave radio (VSWR) measurement data of the antenna; and
   selectively determining whether at least one of the detection mechanism and an antenna mast is installed based on the VSWR measurement data.

2. The method of claim 1, further comprising determining whether the VSWR measurement data is within a first range, and wherein the selectively determining is based on whether the VSWR measurement data is within the first range.

3. The method of claim 2, wherein the selectively determining comprises determining that the antenna mast is installed when the VSWR measurement data is within the first range.

4. The method of claim 2, further comprising determining whether the VSWR measurement data is greater than a top threshold of the first range, and wherein the selectively determining is based on whether the VSWR measurement data is greater than the top threshold of the first range.

5. The method of claim 4, wherein the selectively determining comprises determining that the detection mechanism is installed when the VSWR measurement data is greater than the top threshold.

6. The method of claim 5, further comprising generating a warning signal indicating that the detection mechanism is installed.

7. The method of claim 6, further comprising at least one of setting a fault code of the vehicle, illuminating a warning lamp of the vehicle, generating an audible warning within the vehicle, and displaying a warning message in a display system of the vehicle based on the warning signal.

8. The method of claim 2, further comprising determining whether the VSWR measurement data is less than a bottom threshold of the first range, and wherein the selectively determining is based on whether the VSWR measurement data is less than the bottom threshold of the first range.

9. The method of claim 8, wherein the selectively determining comprises determining that the detection mechanism is not installed when the VSWR measurement data is less than the bottom threshold.

10. The method of claim 8, wherein the selectively determining comprises determining that the antenna is not installed or is damaged when the VSWR measurement data is less than the bottom threshold.

11. The method of claim 10, further comprising generating a warning signal indicating that antenna is not installed or is damaged.

12. The method of claim 11, further comprising at least one of setting a fault code of the vehicle, illuminating a warning lamp of the vehicle, generating an audible warning within the vehicle, and displaying a warning message in a display system of the vehicle based on the warning signal.

13. A system for monitoring an antenna having a removable detection mechanism, comprising:
   a first module that monitors voltage standing wave radio (VSWR) measurement data of the antenna; and
   a second module that selectively determines whether at least one of the detection mechanism and an antenna mast is installed based on the VSWR measurement data.

14. The system of claim 13, wherein the first module at least one of determines whether the VSWR measurement data is within a first range, determines whether the VSWR measurement data is greater than a top threshold of the first range, and determines whether the VSWR measurement data is less than a bottom threshold of the first range.

15. The system of claim 14, wherein the second module selectively determines that the antenna mast is installed when the VSWR measurement data is within the first range.

16. The system of claim 14, wherein the second module determines that the detection mechanism is installed when the VSWR measurement data is greater than the top threshold.

17. The system of claim 14, wherein the second module determines that the detection mechanism is not installed when the VSWR measurement data is less than the bottom threshold.

18. The system of claim 14, wherein the second module determines that the antenna mast is at least one of not installed and damaged when the VSWR measurement data is less than the bottom threshold.

19. The system of claim 13, further comprising a third module that generates a warning signal based on whether the second module selectively determines that at least one of the detection mechanism and an antenna mast is installed.

20. The system of claim 13, wherein the antenna is a vehicle antenna and wherein the detection mechanism is removably coupled to an antenna base of the vehicle antenna.

* * * * *